United States Patent
Speer et al.

(10) Patent No.: US 9,587,808 B2
(45) Date of Patent: Mar. 7, 2017

(54) FIXTURE DESIGN FOR FLEXIBLE LED CIRCUIT BOARDS

(71) Applicants: Richard Speer, Concord, MA (US); David Hamby, Andover, MA (US); Ken Grossman, Beverly, MA (US)

(72) Inventors: Richard Speer, Concord, MA (US); David Hamby, Andover, MA (US); Ken Grossman, Beverly, MA (US)

(73) Assignee: OSRAM SYLVANIA Inc., Wilmington, MA (US)

( * ) Notice: Subject to any disclaimer, the term of this patent is extended or adjusted under 35 U.S.C. 154(b) by 8 days.

(21) Appl. No.: 14/075,001

(22) Filed: Nov. 8, 2013

(65) Prior Publication Data
US 2015/0131289 A1    May 14, 2015

(51) Int. Cl.
*F21S 4/00*    (2016.01)
*F21V 21/00*    (2006.01)
(Continued)

(52) U.S. Cl.
CPC .............. *F21V 15/012* (2013.01); *F21K 9/65* (2016.08); *F21K 9/90* (2013.01); *F21S 8/00* (2013.01);
(Continued)

(58) Field of Classification Search
CPC .......... F21V 15/012; F21V 15/01; F21K 9/90; F21K 9/58; F21K 2101/02; F21K 9/65;
(Continued)

(56) References Cited

U.S. PATENT DOCUMENTS 5,585,783 A * 12/1996 Hall ............................... 340/473
2007/0081340 A1 * 4/2007 Chung et al. .................. 362/294
(Continued)

FOREIGN PATENT DOCUMENTS

DE      20107420 U1    7/2001
DE    102009023052 A1   12/2010
(Continued)

OTHER PUBLICATIONS

Patent Abstract of EP 2058581 (A2), Publication Date: May 13, 2009, downloaded from espacenet on Jun. 10, 2015 (1 page).
(Continued)

*Primary Examiner* — Bao Q Truong
*Assistant Examiner* — Glenn Zimmerman
(74) *Attorney, Agent, or Firm* — Edward S. Podszus

(57) ABSTRACT

Techniques are disclosed for designing light fixtures for flexible LED circuit boards. The flexible LED circuit boards include an array of LED packages and the surface of the flexible circuit boards is highly reflective. A flexible LED circuit board may be shaped to conform to a rigid preform and the preform may be concave, convex, corrugated, or have any other custom shape. The shape of the preform, as well as the location of the LEDs within the flexible LED circuit may determine the light distribution of the light fixture. Alternatively, the lighting fixture may have multiple rods held in place with side plates and a flexible LED circuit board may be woven between the rods. A set of hole patterns in the side plates determine the location of the rods and the rods will determine the shape of the flexible LED circuit.

18 Claims, 9 Drawing Sheets

(51) Int. Cl.
*F21V 15/01* (2006.01)
*F21K 99/00* (2016.01)
*F21S 8/00* (2006.01)
*H05K 1/18* (2006.01)
*H05K 3/00* (2006.01)
*F21Y 101/00* (2016.01)

(52) U.S. Cl.
CPC ............ *F21V 15/01* (2013.01); *F21Y 2101/00* (2013.01); *F21Y 2107/10* (2016.08); *F21Y 2107/20* (2016.08); *F21Y 2107/50* (2016.08); *F21Y 2115/10* (2016.08); *H05K 1/189* (2013.01); *H05K 3/0058* (2013.01); *H05K 2201/0129* (2013.01); *H05K 2201/056* (2013.01); *H05K 2201/10106* (2013.01); *Y10T 29/49124* (2015.01)

(58) Field of Classification Search
CPC .... F21S 8/00; F21Y 2101/02; F21Y 2107/10; F21Y 2107/20; F21Y 2115/10; F21Y 2107/50; F21Y 2101/00; Y10T 29/49124; H05K 1/189; H05K 3/0058; H05K 2201/0129; H05K 2201/056; H05K 2201/10106
USPC .......... 362/249.04, 235, 249.06, 249.14, 362
See application file for complete search history.

(56) References Cited

U.S. PATENT DOCUMENTS

| | | |
|---|---|---|
| 2012/0043910 A1 | 2/2012 | Nagashima et al. |
| 2012/0069556 A1 | 3/2012 | Bertram et al. |
| 2012/0075853 A1 | 3/2012 | Tsai |
| 2012/0113606 A1* | 5/2012 | Preuschl .............. H05K 1/0278 361/752 |
| 2013/0271991 A1* | 10/2013 | Hussell et al. ........... 362/249.02 |
| 2014/0369038 A1* | 12/2014 | Tischler et al. ............... 362/235 |
| 2015/0062901 A1* | 3/2015 | Chen .................... F21V 15/012 362/249.04 |

FOREIGN PATENT DOCUMENTS

| | | | |
|---|---|---|---|
| EP | 2058581 A2 | 5/2009 | |
| JP | 2007115577 A | 5/2007 | |
| WO | 2010125513 A1 | 11/2010 | |
| WO | WO 2012016047 A8 * | 9/2012 | ........... G02B 6/0013 |

OTHER PUBLICATIONS

Patent Abstract of JP, Publication No. 2007-115577, Publication Date: May 10, 2007 downloaded from the European Patent Office (1 page).

* cited by examiner

Fig. 2a
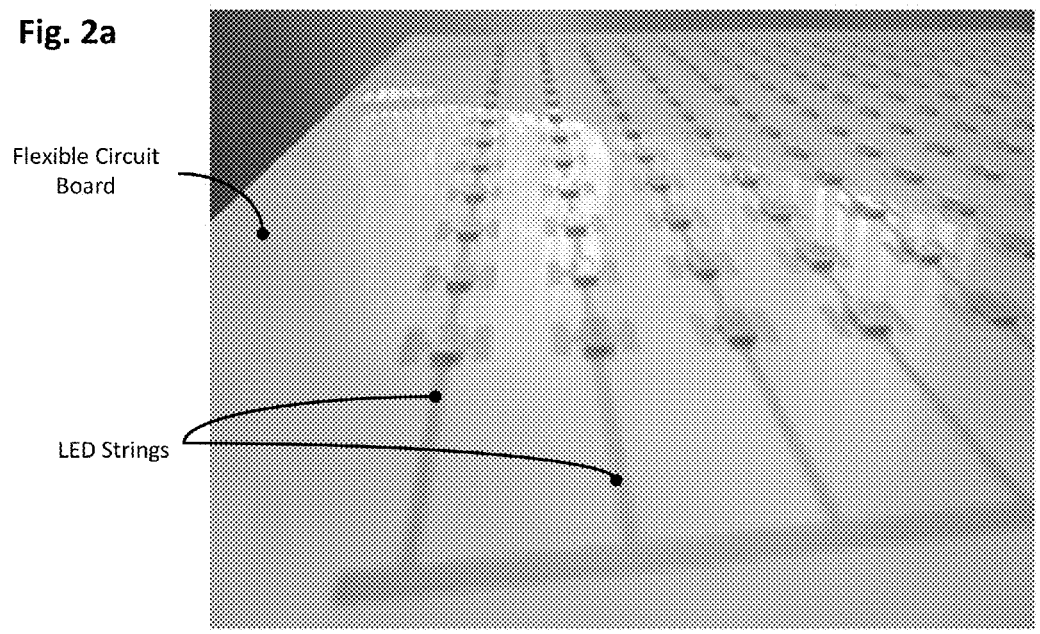
Flexible Circuit Board
LED Strings
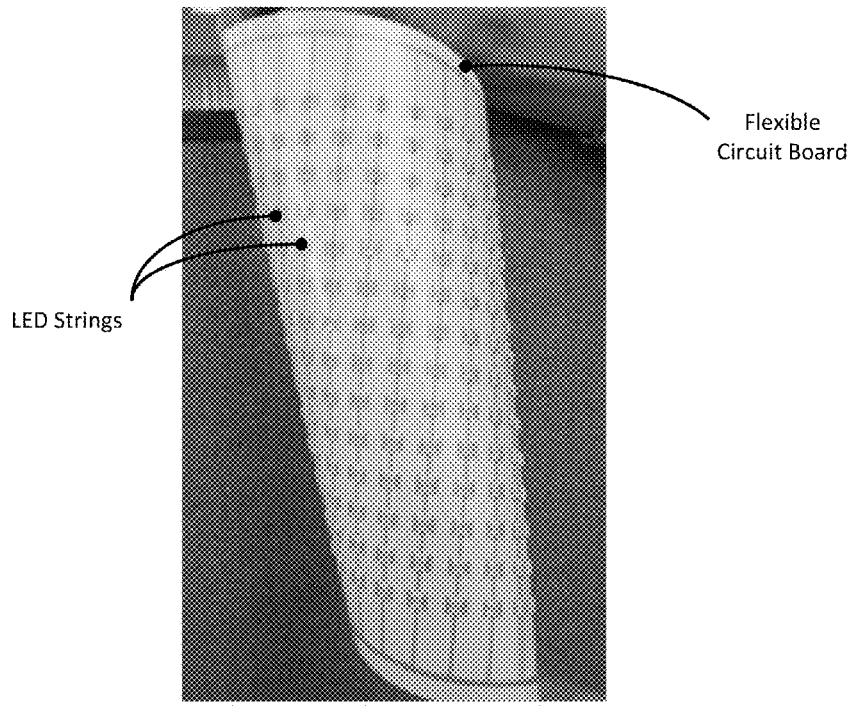
Flexible Circuit Board
Fig. 2b
LED Strings

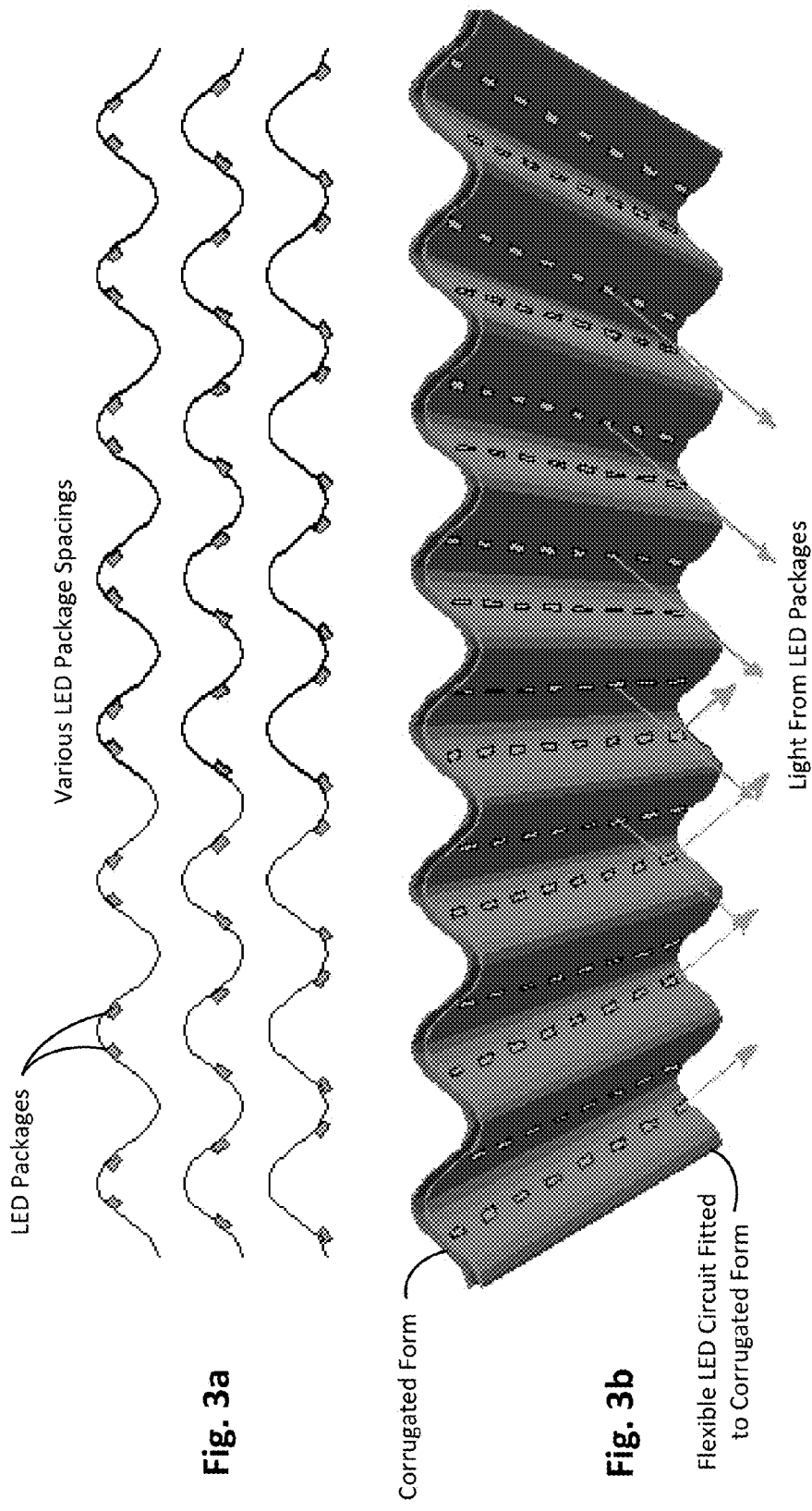
Fig. 3a — Various LED Package Spacings; LED Packages
Fig. 3b — Corrugated Form; Flexible LED Circuit Fitted to Corrugated Form; Light From LED Packages

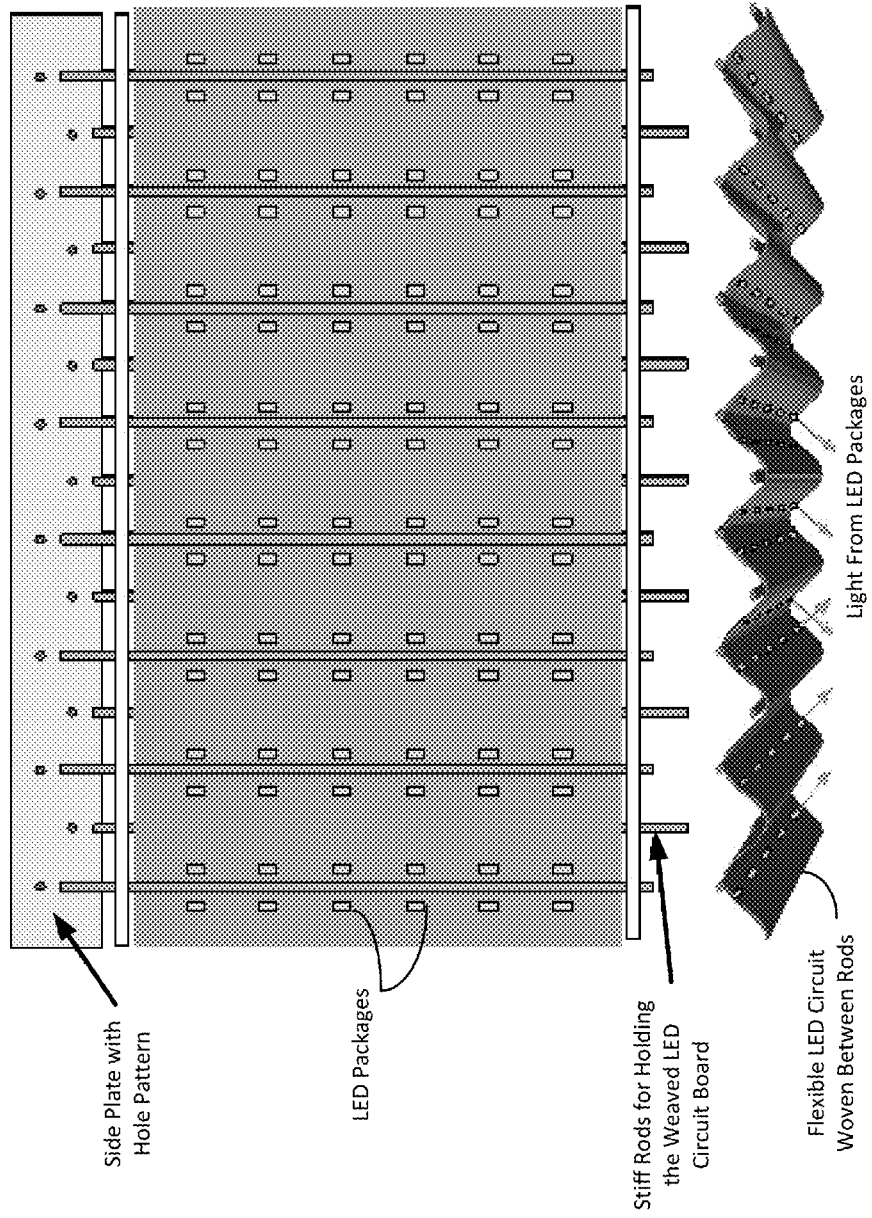

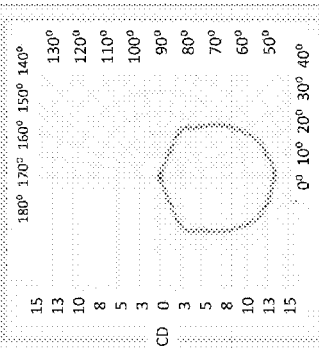
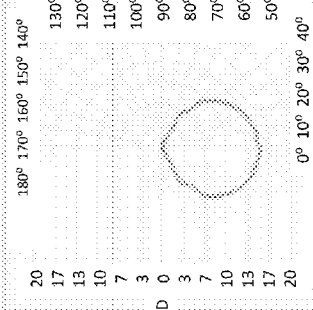
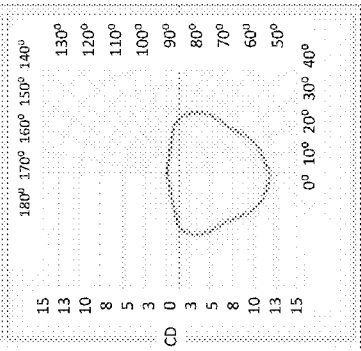
Fig. 5b
Fig. 5d
Fig. 5f
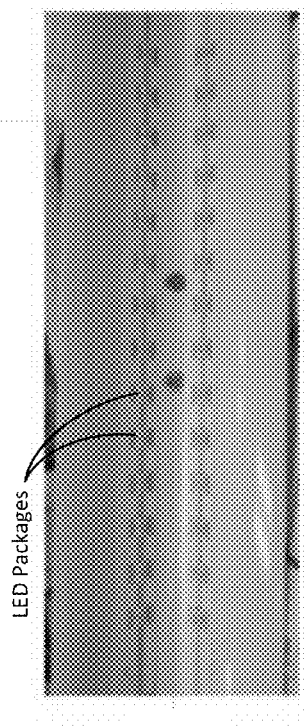
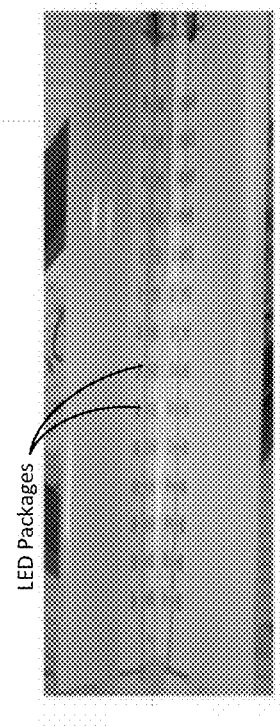
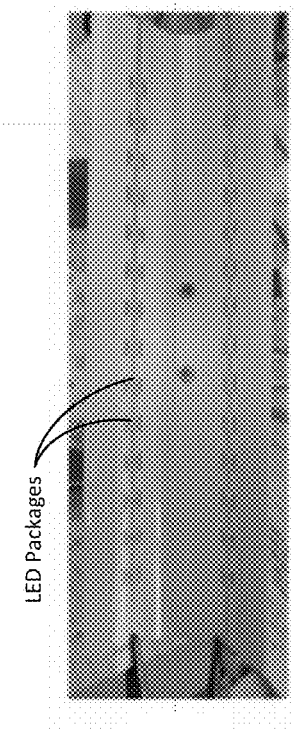
Fig. 5a
Fig. 5c
Fig. 5e

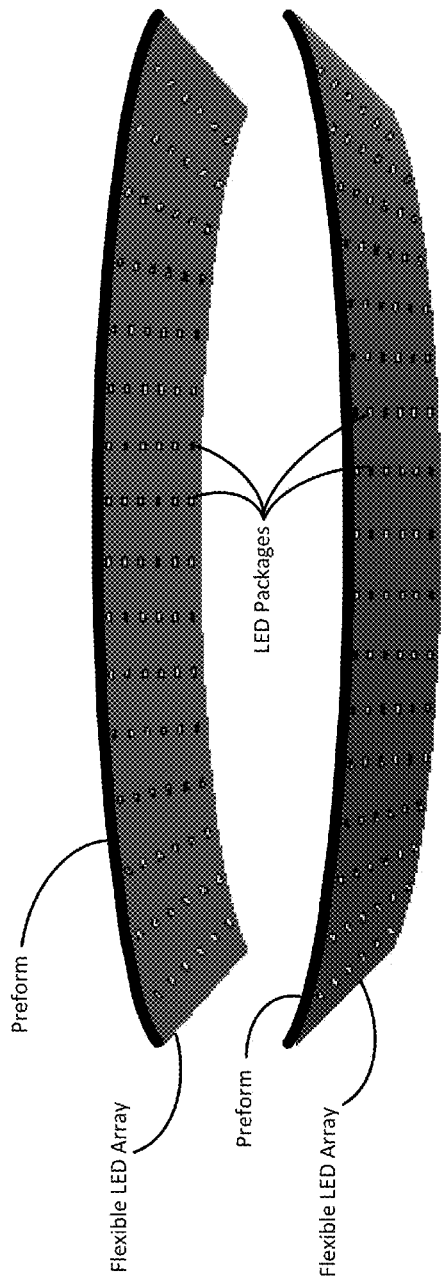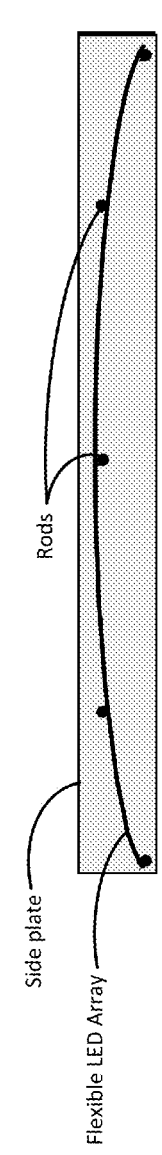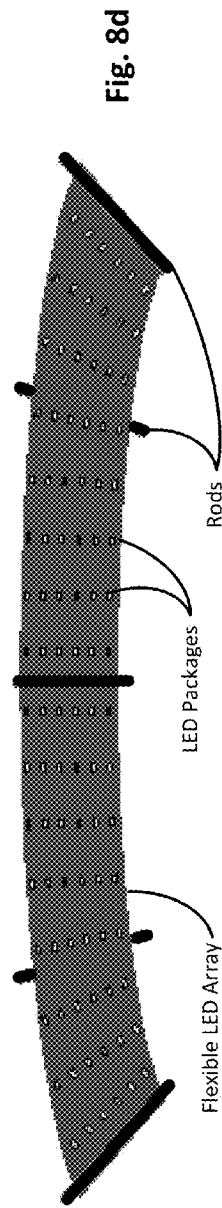

… (1)

FIXTURE DESIGN FOR FLEXIBLE LED CIRCUIT BOARDS

FIELD OF THE DISCLOSURE

This disclosure relates to lighting fixtures, and more specifically to flexible LED circuit board fixtures.

BACKGROUND

In lighting systems luminaires and LED arrays may be mounted using various lighting fixtures. Once the lighting fixture is assembled, the light distribution pattern it provides is typically fixed.

BRIEF DESCRIPTION OF THE DRAWINGS

FIGS. 2a-b illustrate two examples of flexible LED circuits fabricated with screen printed Ag ink on polyester including multiple LED strings connected in parallel.

FIG. 3a shows a cross-sectional view of various LED package spacings that may provide different light distributions, according to an embodiment of the present invention.

FIG. 3b shows a view from below of the flexible LED circuit fitted to a corrugated form, according to one embodiment of the present invention.

FIGS. 4a-c collectively illustrate an example LED lighting fixture with a flexible LED circuit woven between rods, according to an embodiment of the present invention.

FIGS. 5a-f collectively illustrate three LED package spacings along with their corresponding light distribution patterns, according to various embodiments of the present invention.

FIGS. 8a-d illustrate various shapes and fixture designs for flexible LED circuits, according to various embodiments of the present invention.

DETAILED DESCRIPTION

Figure 1:
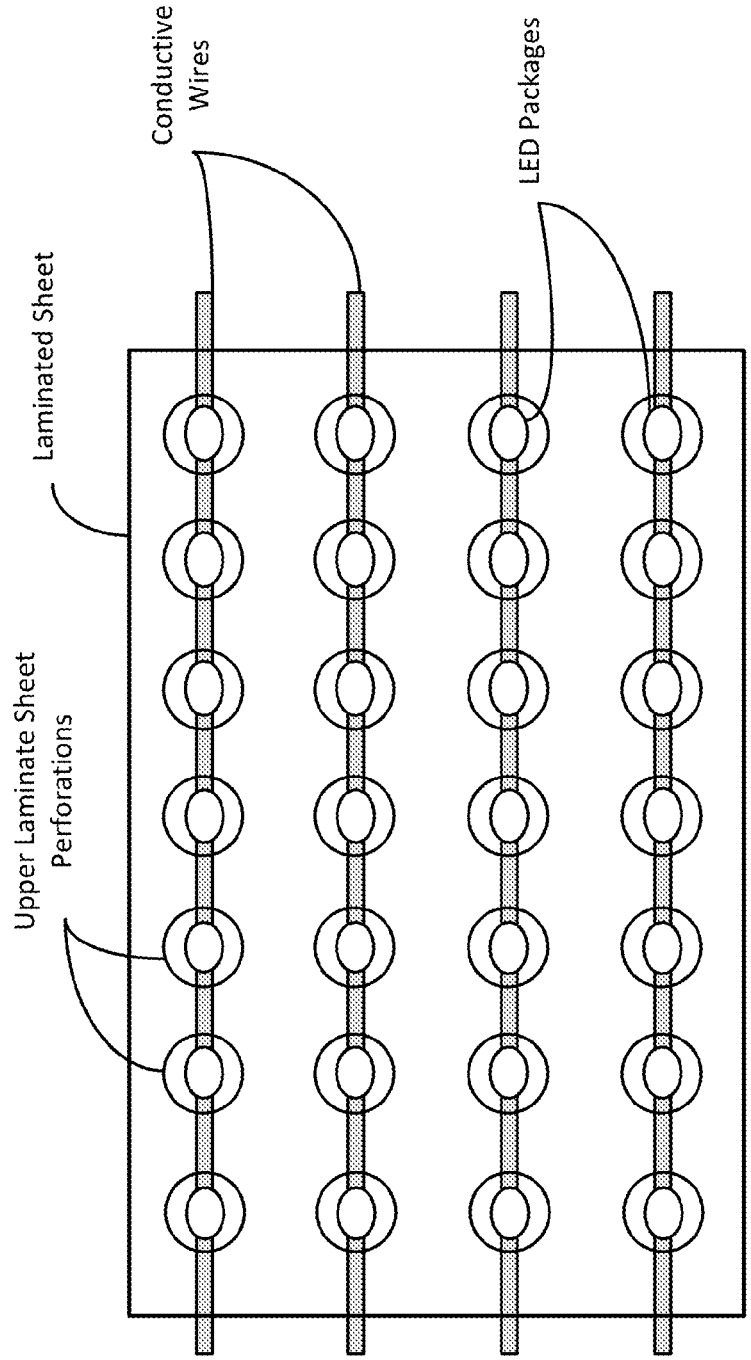
FIG. 1 shows a flexible laminated LED circuit.

Techniques are disclosed for designing light fixtures for flexible LED circuit boards. The flexible LED circuit boards include an array of LED packages or LED chips and the surface of the flexible circuit boards is highly reflective, in some embodiments. In one example, a flexible LED circuit board may be shaped to conform to a rigid preform and the preform may be concave, convex, corrugated, or have any other custom shape depending on the desired light distribution pattern. In such an example, the shape of the preform as well as the location of the LEDs within the flexible LED circuit will determine the light distribution of the light fixture. Alternatively, the lighting fixture may have multiple rods held in place with side plates and a flexible LED circuit board may be woven between the rods, in some embodiments. In such embodiments, a set of hole patterns in the side plates will determine the location of the rods and the rods will determine the shape of the flexible LED circuit. In some cases, the side plates may include multiple hole patterns and attaching the rods to different hole patterns will result in different light distributions. The location of the rods as well as how the flexible LED circuit is woven between the rods will determine the final shape of the LED circuit within the lighting fixture.

General Overview

Flexible substrates with screen printed circuit patterns are used to fabricate flexible circuit boards. However, flexible LED circuit boards with reflective substrates may be configured into multiple shapes and may provide various light distribution patterns with the same physical parts. Furthermore, different LED placements within a flexible circuit board may provide different light distributions even if the shape of the flexible circuit is held constant. A lighting fixture may be designed that takes advantage of these unique characteristics of a flexible LED circuit board.

Thus, in accordance with an embodiment of the present invention, a lighting fixture is disclosed for housing a flexible circuit board populated with an array of LED packages or LED chips. The flexible substrate of the LED array may be a reflective material (e.g., PET), and the circuit pattern may be screen printed onto the substrate, in some embodiments, which can reduce production cost as compared to standard circuit boards or metal substrate boards. The flexible board may be shaped prior to being used in a light fixture, in some cases, and the flexible board may conform to a non-flat shape, in some embodiments. Such a design has a low input power density such that heat may be dissipated by convection and radiation and no heat sink is required. In one embodiment, a flexible LED array with a reflective surface may provide customized light delivery with a fixed set of parts. For example, the same parts may be used to provide a highly directed light source or a dissipated light source depending on the contours of the flexible LED array and the spacing of the LEDs within the array.

In one example embodiment, a flexible LED array is placed against a curved preform and the LED linear arrangements may be either separate strips with appropriate electrical connections or printed circuit patterns on a large flexible sheet. The curved preform may be concave, convex, corrugated, or any other custom shape depending upon the intended light distribution. In some cases, the curved preform may be a section of PVC corrugated roofing material. In another embodiment, the flexible LED array may be laced between a number of rods and the placement of the rods may customize the shape of the LED array and therefore the light distribution. In one such example, the lighting fixture may include two side plates that hold the rods in place.

In some embodiments, custom screen printed circuits or LED arrays may be matched with the correct fixture configuration in order to achieve the desired light distribution. The variations in shape and LED placement would contribute to the final light distribution and could be customized for particular applications without major changes in parts.

Example Fixtures for Flexible LED Circuits

FIG. 1 shows a flexible laminated LED circuit. As can be seen, the LED circuit includes four copper ribbons and the upper laminate sheet has multiple perforations exposing portions of the copper ribbons for the placement of the LED packages. The upper laminate sheet in this particular embodiment is transparent and the entire copper ribbons are visible, while the lower laminate sheet has a reflective upper surface. In other embodiments, the upper laminate sheet may have a reflective upper surface. Although this particular example shows four copper ribbons laminated between two sheets, other embodiments may include fewer or more copper ribbons and the copper ribbons may be replaced with copper wires, or any other suitable conductive material. In some cases, the thin copper ribbon may be around 0.003 inches thick. The LED packages may be attached using a conductive epoxy or solder, in some embodiments. Because the LED packages are being attached to a metallic conductive wire (a copper ribbon in this example), solder may be used in order to avoid the difficulties associated with conductive epoxies.

FIGS. 2a-b illustrate examples of flexible LED circuit boards including multiple LED strings connected in parallel. As can be seen in the example of FIG. 2a, a flexible LED circuit may be fabricated with screen printed Ag ink on a flexible substrate, in some embodiments. The substrate could be, for example, PET or any other suitable flexible substrate material. LED packages may be connected in series along the conductive traces to form multiple LED strings and the surface of the flexible circuit board may be reflective. FIG. 2b illustrates the flexibility of the LED circuit board when it is rolled.

FIG. 3a shows a cross-sectional view of various LED package spacings that may provide different light distributions, according to an embodiment of the present invention. As can be seen in this example, the flexible LED array is arranged in a corrugated shape and the top LED package spacing has the LEDs near the crest of each corrugated wave, while the middle LED package spacing has the LEDs at the center of each corrugated wave, and the lower LED package spacing has the LEDs at the bottom of each corrugated wave. FIG. 3b shows a view from below of the flexible LED circuit fitted to a corrugated form, according to one embodiment of the present invention. The direct light path from the LED packages is shown. Such a corrugated shape could be readily used in various area lighting applications including, for example, a drop ceiling light fixtures with dimensions of 2 ft.×2 ft. or 2 ft.×4 ft. However, the lighting fixtures described herein could be designed for any area lighting application and the present invention is not intended to be limited to any particular size or set of dimensions.

FIGS. 4a-c collectively illustrate an example LED lighting fixture with a flexible LED circuit woven between rods, according to an embodiment of the present invention. In such an embodiment, the flexible circuit board may be mounted within a lighting fixture housing without being attached to the surface of a rigid preform. Such a fixture may provide a more versatile system whereby the "wavelength" and the "amplitude" of the shaped flexible LED circuit would be more customizable based on the location of the rods. The example LED circuit board in FIGS. 4a-c has the LED packages placed such that they are near the crest of the circuit board wave pattern. As can be seen in FIG. 4a, the rods in this example define the shape of the flexible LED circuit when the circuit is woven between the rods. As can be seen in the example of FIG. 4b, this design has two side plates, each having hole patterns through which the rods may be placed. FIG. 4c shows a view from below of the flexible LED circuit, and the direct light path from the LED packages is shown. The direction of the light from the LED packages may be changed, for example, by changing the spacing and location of the rods.

FIGS. 5a-f collectively illustrate three LED package spacings along with their corresponding light distribution patterns, according to various embodiments of the present invention. In these example embodiments, the light distribution is influenced by locating the LED strips at different points along the "curve" or "wave" of the corrugated LED circuit (whether the circuit is attached to a corrugated preform or shaped using rods and side plates). FIG. 5a shows the LED strips placed near the crest of the corrugated LED circuit and FIG. 5b is a graph of the corresponding polar light distribution. FIG. 5c shows the LED strips placed near the middle of the corrugated LED circuit shape and FIG. 5d is a graph of the corresponding polar light distribution. FIG. 5e shows the LED strips placed near the bottom of the corrugated LED circuit shape and FIG. 5f is a graph of the corresponding polar light distribution. The polar light distribution plots shown in FIGS. 5b, 5d, and 5f graph the light intensity in candelas (CD) and demonstrate that there is a significant difference in the light distribution pattern for each LED strip placement. As can be seen, therefore, the light distribution of a flexible LED circuit is customizable using the same basic parts, depending on the location of the LED strips within the shaped LED circuit.

Figure 6A:
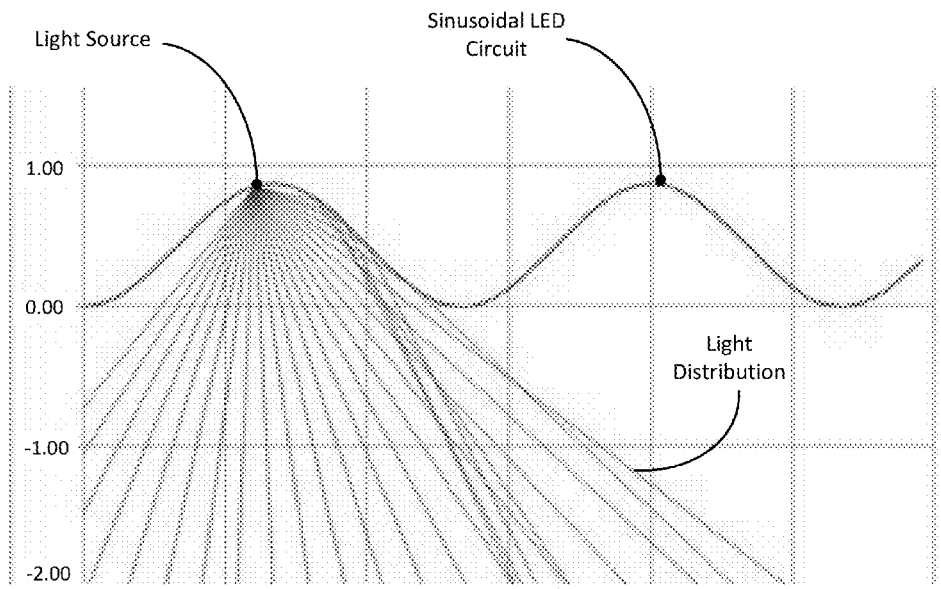
FIGS. 6a-b show graphs of the light distribution coming from two points along a sinusoidal shaped flexible LED circuit, according to two embodiments of the present invention.
Figure 6B:
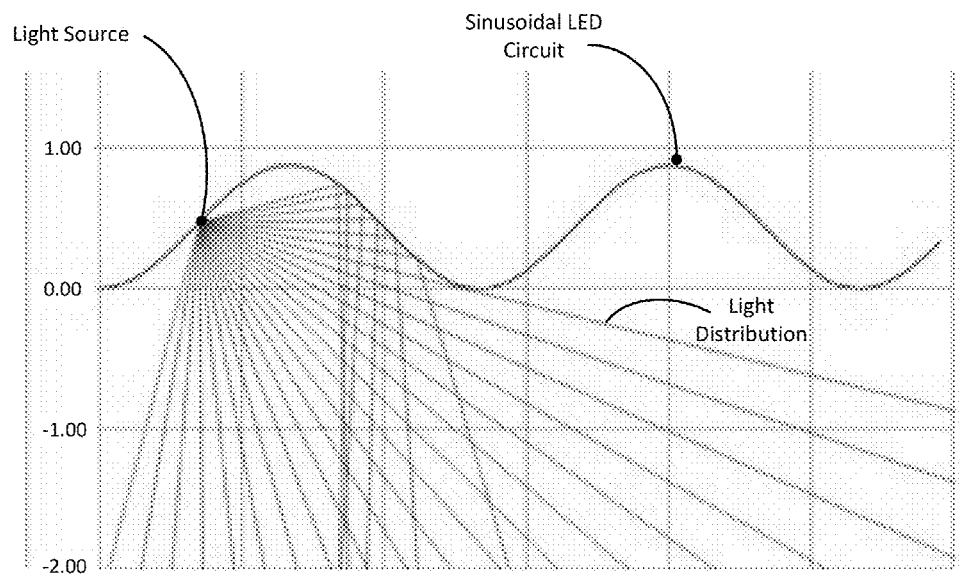

FIGS. 6a-b show graphs of the light distribution coming from two points along a sinusoidal shaped flexible LED circuit, according to two embodiments of the present invention. In these example embodiments, non-diffused reflection is assumed for illustrative purposes. The example in FIG. 6a shows the light distribution coming from a point near the crest of the sinusoidal LED circuit, while the example in FIG. 6b shows the light distribution coming from a point near the middle of the sinusoidal LED circuit. In one specific example embodiment, a flat array of Lambertian LED packages may produce a Lambertian light distribution when used in a downward facing lighting application, as shown in these example embodiments. As can be seen when comparing the example of FIG. 6a with the example of FIG. 6b, minor changes in the LED package locations would produce different light distribution patterns other than a Lambertian distribution.

Figure 7:
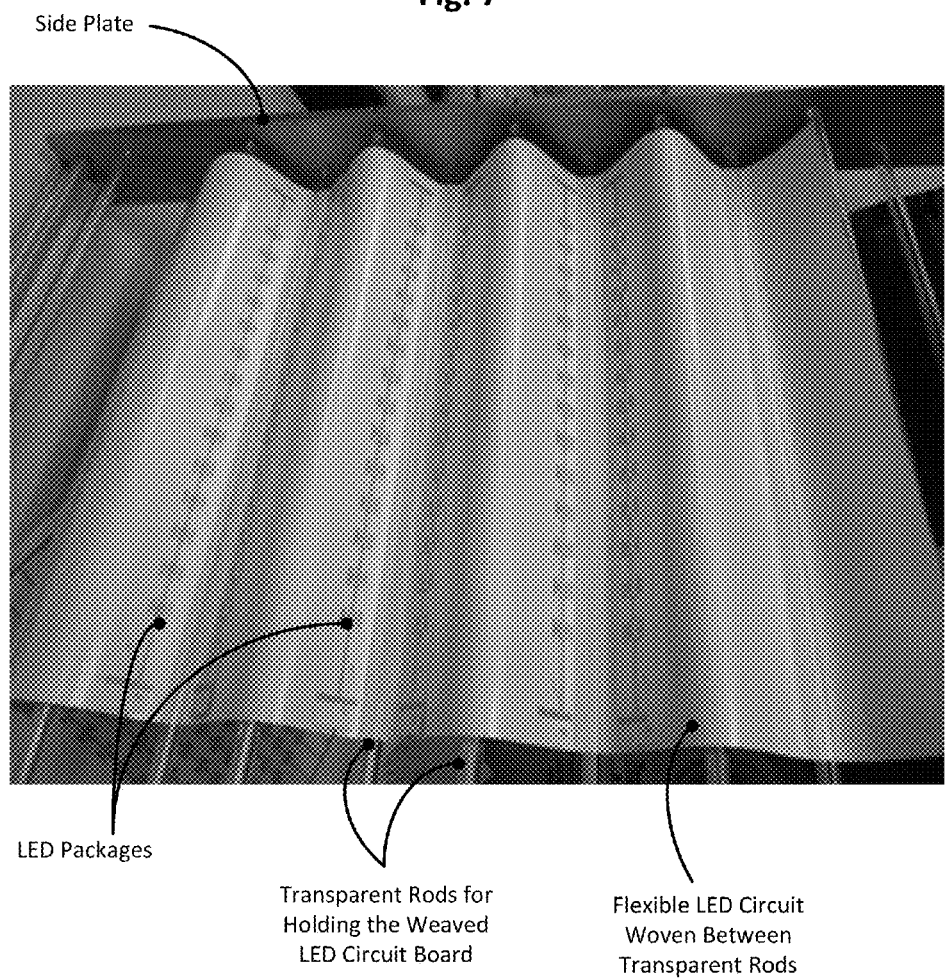
FIG. 7 shows an example flexible LED circuit including multiple LED packages woven between transparent rods, according to an embodiment of the present invention.

FIG. 7 shows an example flexible LED circuit including multiple LED packages woven between transparent rods, according to an embodiment of the present invention. In this particular example embodiment, the rods are glass tubes and the side plates are ¼ inch aluminum plates having a particular hole-pattern. In other embodiments, side plates may include multiple hole-patterns and the user may configure the rod placement as desired. In still other embodiments, a consumer may specify the type of light distribution desired and the rod placement may be determined and the circuit may be laced for the desired application. The rods could be made of reflective material and may be fastened with setscrews or held with lock nuts on the end of threaded rods, in some embodiments. The rods may also be replaced with cables laced through the hole pattern and held taught at the ends, in some embodiments. Such cables could be thin and coated with a reflective material.

FIGS. 8a-d illustrate various shapes and fixture designs for flexible LED circuits, according to various embodiments of the present invention. FIG. 8a shows a flexible LED array attached to a concave down rigid preform, while FIG. 8b shows a flexible LED array attached to a concave up rigid preform, and each LED circuit shape provides a specific light distribution pattern. FIGS. 8c-d show a concave down configuration for a flexible LED circuit utilizing a rod and side plate configuration. FIG. 8c is a cross-sectional view of the rod and side plate fixture with the flexible LED circuit woven between the rods while FIG. 8d shows the same configuration from below. Various shapes and heights may be used for the rigid forms, and in some cases the flexible LED circuit may be replaced with a new flexible LED board with the same or different pattern and the fixture itself could remain the same. The various preforms and rod arrangements may be incorporated within a light fixture housing, in some embodiments.

Methodology

Figure 9:
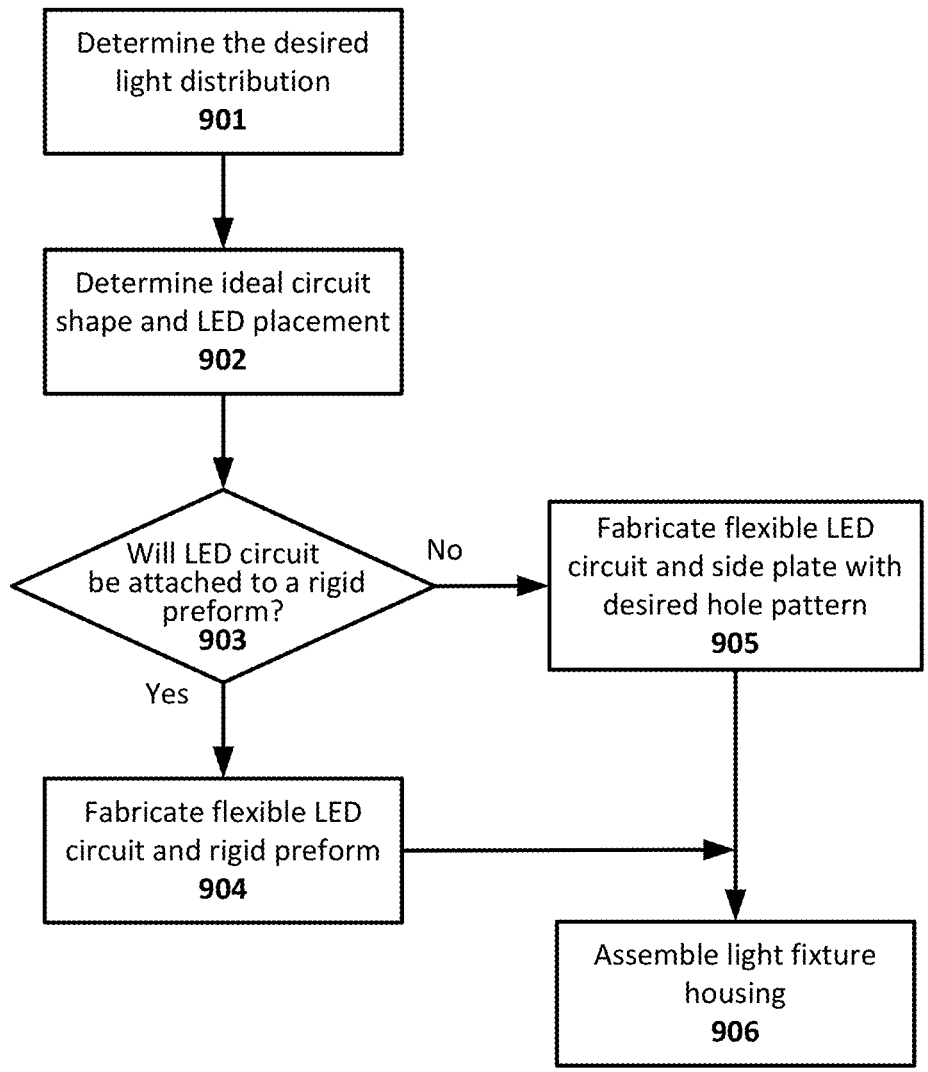
FIG. 9 illustrates a method for fabricating a light fixture for a flexible LED lighting circuit, according to an embodiment of the present invention.

FIG. 9 illustrates a method for fabricating a light fixture for a flexible LED lighting circuit, according to an embodiment of the present invention. The method may begin with determining 901 the desired light distribution. Once the desired light distribution is known, the method may continue with determining 902 the ideal circuit shape and LED placement in order to achieve the desired light distribution. As discussed above, the light distribution may be manipulated by altering the shape of the flexible LED circuit as well as the placement of the LED strings within the LED circuit. The method may continue with determining 903 whether the flexible LED circuit will be fastened to a rigid form. In some cases, the rigid preform may be concave, convex, corrugated, or any other suitable shape for achieving the desired light distribution. If the LED circuit will be fastened to a rigid form, the method may continue with fabricating 904 the flexible LED circuit and the rigid form. As discussed above, the shape of the preform as well as the placement of the LED strings within the flexible LED circuit depends on the desired light distribution. The method may then continue with assembling 906 the light fixture housing, which may include attaching the LED circuit to the rigid preform. If the flexible LED circuit is not to be attached to a rigid form, the method may continue with fabricating 905 the flexible LED circuit and light fixture side plates with the desired hole patterns or achieving the intended light distribution. As discussed above, the hole patterns in the side plates are used for inserting the rods which will determine the shape of the flexible LED circuit. The method may then continue with assembling 906 the light fixture housing, which in this particular case includes inserting transparent or reflective rods into the holes of the side plates and weaving the flexible LED circuit between the rods.

Numerous embodiments will be apparent, and features described herein can be combined in any number of configurations. One example embodiment of the present invention provides a lighting fixture. The lighting fixture includes a lighting fixture housing, and a rigid preform mounted to the housing, the preform having a non-flat shape determined by a desired light distribution pattern produced when a flexible LED circuit is attached to the preform. In some cases, the rigid preform is concave down when mounted to the housing. In some cases, the rigid preform is concave up when mounted to the housing. In some cases, the rigid preform is corrugated. In some cases, the fixture includes the flexible LED circuit conforming to the shape of the rigid preform. In some such cases, the flexible LED circuit has a reflective surface. In other such cases, the spacing of LEDs within the flexible LED circuit is determined by the light distribution pattern produced when the flexible LED circuit is attached to the preform. In some cases, the lighting fixture is configured to provide a customized light distribution pattern by attaching to the rigid preform flexible LED circuits having different LED arrangements.

Another embodiment of the present invention provides a method of fabricating a lighting fixture. The method includes determining a desired light distribution pattern, and fabricating a flexible LED circuit housing configured to hold a flexible LED circuit in a desired non-flat shape, the shape being determined based on the desired light distribution pattern. In some cases, the housing for the flexible LED circuit includes a rigid preform and the shape of the preform is determined by the light distribution pattern produced when the flexible LED circuit is attached to the preform. In some cases, the method further includes fabricating the flexible LED circuit housing wherein the spacing of LEDs within the circuit is determined based on the desired light distribution pattern. In some such cases, the flexible LED circuit has a reflective surface. In some cases, the flexible LED circuit housing is configured to hold the flexible LED circuit in a concave down shape. In some cases, the flexible LED circuit housing is configured to hold the flexible LED circuit in a concave up shape. In some cases, the flexible LED circuit housing is configured to hold the flexible LED circuit in a corrugated shape. In some cases, the housing includes at least two side plates to which the rigid preform is secured. In some cases, determining the desired light distribution pattern includes receiving a desired light distribution pattern from a customer.

Another embodiment of the present invention provides a lighting fixture. The lighting fixture includes a lighting fixture housing having at least two side plates. The method also includes a flexible LED circuit having a reflective surface, and a rigid preform mounted to the at least two side plates, the preform having a non-flat shape determined by a desired light distribution pattern produced when the flexible LED circuit is attached to the preform. In some cases, the spacing of LEDs within the flexible LED circuit is determined by the light distribution pattern produced when the flexible LED circuit is attached to the preform. In some cases, the shape of the rigid preform is at least one of concave up, concave down, or corrugated.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A lighting fixture comprising:
a lighting fixture housing having at least two side plates;
a rigid preform mounted to the at least two side plates, the preform having a non-flat shape;
at least one flexible LED circuit board attached to the preform, wherein the shape of the rigid preform is at least one period of a wave.

2. The fixture of claim 1 wherein the rigid preform is concave down when mounted to the housing.

3. The fixture of claim 1 wherein the rigid preform is concave up when mounted to the housing.

4. The fixture of claim 1 wherein the rigid preform is corrugated.

5. The fixture of claim 1 further comprising the flexible LED circuit board conforming to the shape of the rigid preform.

6. The fixture of claim 1 wherein the lighting fixture is configured to provide a customized light distribution pattern by attaching the flexible LED circuit boards having different LED arrangements to the rigid preform.

7. The lighting fixture of claim 1, wherein the flexible LED circuit board further comprises PET.

8. The fixture of claim 5 wherein the flexible LED circuit board has a reflective surface.

9. The fixture of claim 5 wherein the spacing of LEDs within the flexible LED circuit board is determined by a light distribution pattern produced when the flexible LED circuit board is attached to the preform.

10. A method of fabricating a lighting fixture comprising:
determining a desired light distribution pattern; and
fabricating a housing configured to hold a flexible LED circuit in a non-flat shape, the shape being determined based on the desired light distribution pattern wherein the non-flat shape is a wave having at least one full period of concave up and concave down; and wherein
the housing comprises a rigid preform having the non-flat shape, wherein the flexible LED circuit is attached to the preform, and
the housing comprises at least two side plates to which the rigid preform is secured.

11. The method of claim 10 further comprising fabricating the flexible LED circuit wherein the spacing of LEDs within the circuit is determined based on the desired light distribution pattern.

12. The method of claim 10 wherein the flexible LED circuit housing is configured to hold the flexible LED circuit in a concave down shape.

13. The method of claim 10 wherein the flexible LED circuit housing is configured to hold the flexible LED circuit in a concave up shape.

14. The method of claim 10 wherein the housing is configured to hold the flexible LED circuit in a corrugated shape.

15. The method of claim 10 wherein determining the desired light distribution pattern comprises receiving a desired light distribution pattern from a customer.

16. The method of claim 11 wherein the flexible LED circuit has a reflective surface.

17. A lighting fixture comprising:
a lighting fixture housing having at least two side plates;
a flexible LED circuit board having a reflective surface; and
a rigid preform mounted to the at least two side plates, the preform having a non-flat shape, wherein the flexible LED circuit board is attached to the preform, and wherein the shape of the rigid preform is at least concave up and concave down.

18. The fixture of claim 17 wherein a spacing of LEDs within the flexible LED circuit board is determined by a light distribution pattern produced by the flexible LED circuit board attached to the preform.

* * * * *